(12) United States Patent
Hughes et al.

(10) Patent No.: US 7,055,074 B2
(45) Date of Patent: May 30, 2006

(54) DEVICE TO INHIBIT DUPLICATE CACHE REPAIRS

(75) Inventors: Brian William Hughes, Fort Collins, CO (US); J. Michael Hill, Ft Collins, CO (US); Warren Kurt Howlett, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 765 days.

(21) Appl. No.: 09/842,333

(22) Filed: Apr. 25, 2001

(65) Prior Publication Data

US 2002/0162062 A1    Oct. 31, 2002

(51) Int. Cl.
*G11C 29/00* (2006.01)

(52) U.S. Cl. .............. 714/710; 714/718; 365/200; 365/201

(58) Field of Classification Search .......... 714/723, 714/25, 710, 711, 718; 365/200, 201
See application file for complete search history.

(56) References Cited

U.S. PATENT DOCUMENTS

| | | | | |
|---|---|---|---|---|
| 5,555,212 A | * | 9/1996 | Toshiaki et al. ............ | 365/200 |
| 5,568,408 A | * | 10/1996 | Maeda ........................ | 702/117 |
| 5,717,696 A | * | 2/1998 | Gabillard et al. ............ | 714/721 |
| 6,145,055 A | * | 11/2000 | Fujimoto ..................... | 711/128 |
| 6,246,616 B1 | * | 6/2001 | Nagai et al. ................. | 365/200 |
| 6,310,807 B1 | * | 10/2001 | Ooishi et al. ................ | 365/200 |
| 6,341,090 B1 | * | 1/2002 | Hiraki et al. ................ | 365/200 |

* cited by examiner

*Primary Examiner*—Guy Lamarre
*Assistant Examiner*—Esaw Abraham

(57) ABSTRACT

The present invention is directed to a system and method which manages one or more errors in a plurality of elements. The invention tests an element of the plurality of elements and detects the error in one of the elements. The invention then repairs a group of N elements, wherein N is greater than one and the group of N elements includes the element with the error. The invention inhibits subsequent repairs of the group of N elements.

19 Claims, 4 Drawing Sheets

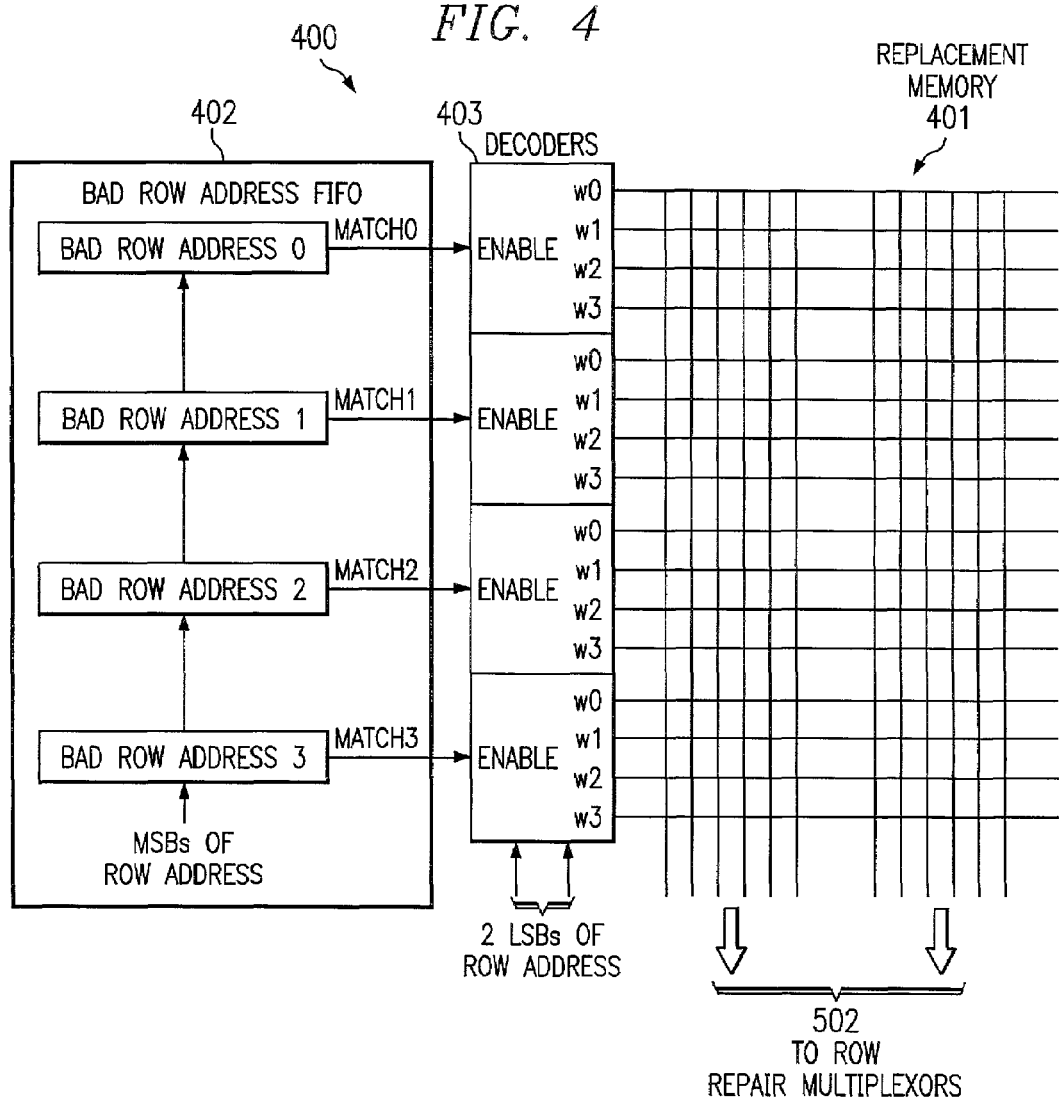

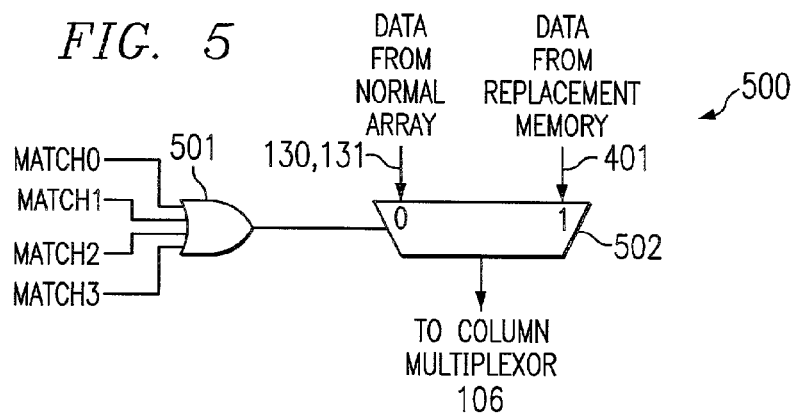

DEVICE TO INHIBIT DUPLICATE CACHE REPAIRS

RELATED APPLICATIONS

The present application is related to concurrently filed, commonly assigned, and U.S. patent application Ser. No. 09/842,435, entitled "SYSTEM AND METHOD FOR MEMORY SEGMENT RELOCATION," the disclosure of which is hereby incorporated herein by reference.

TECHNICAL FIELD

The present invention relates in general to computer hardware and in particular to a system and method for computer system error detection.

BACKGROUND

In the field of computer hardware, it is generally desirable to test arrays of storage and/or processing elements to identify malfunctioning elements. Malfunctioning elements are generally identified by comparing data contained in such elements to an appropriate data template. If one or more malfunctioning elements are identified, appropriate substitution of new hardware locations for the malfunctioning elements is generally implemented.

One prior art approach involves employing hardware to store a bitmap of an array or other hardware architecture being examined. This bitmap generally catalogues locations, possibly by row and column number, of elements containing erroneous data within the array. A corrective operation may then substitute nearby areas on a chip for malfunctioning elements, or for contiguous sequences of elements which include malfunctioning elements. Generally, the bitmap includes data sufficient to describe an entirety of an array or other data processing architecture under test, thereby generally requiring a substantial amount of space on a silicon chip.

One problem associated with the bitmap approach is that considerable silicon area is generally needed to store data sufficient to fully identify the state of an array. In addition, the data processing resources required to process the bitmap and identify an optimal repair strategy generally demand complex on-chip circuitry. The bitmap approach may be implemented off-chip using an external tester having a separate microprocessor. However, when employing such an off-chip solution, a full repair will generally be required at the time the chip is tested. In addition, when using the bitmap approach, both the row and column of a malfunctioning element have to be known for a memory segment repair to be effectively conducted.

Therefore, it is a problem in the art that the bitmap diagnostic approach generally requires allocating a considerable amount of chip space for bitmap storage and processing.

It is a further problem in the art that the data processing resources associated with the bitmap approach generally demand complex circuitry, if implemented on-chip.

SUMMARY OF THE INVENTION

The present invention is directed to a system and method which manages one or more errors in a plurality of elements. The invention preferably tests an element of the plurality of elements and preferably detects the error in one of the elements. The invention then preferably repairs a group of N elements, wherein N is greater than one and the group of N elements includes the element with the error. The invention preferably inhibits subsequent repairs of the group of N elements.

BRIEF DESCRIPTION OF THE DRAWING

FIG. 4 depicts an example of the implementation of replacement memory useable by the invention;

FIG. 5 depicts an example of the implementation of the row repair multiplexor that is useable by the invention; and FIG. 6 depicts a block diagram of a computer system which is adapted to use the present invention.

DETAILED DESCRIPTION

Figure 1:
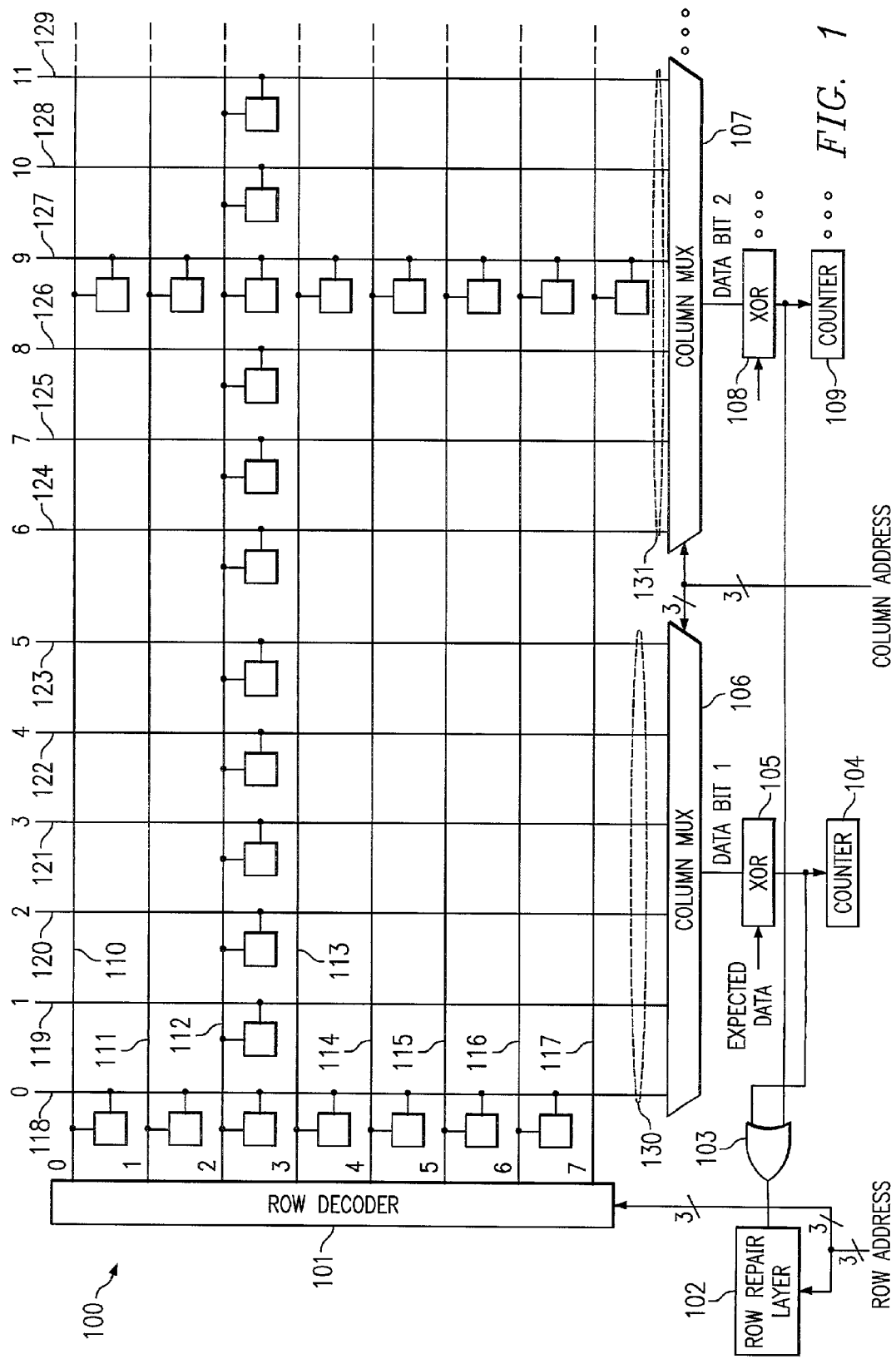
FIG. 1 depicts a random access memory (RAM) array suitable for error detection according to a preferred embodiment of the present invention.

The present invention is preferably directed to a system and method which identifies computer hardware device element failures occurring in a particular region of memory or other computer component. The inventive mechanism preferably establishes a threshold number of errors for selected region below which the selected region is left unmodified by the mechanism of the present invention. However, where the number of errors meets or exceeds this threshold, which is preferably adjustable, corrective action is preferably taken with respect to the memory region as a whole. Note that the threshold may be set in the range of 1 to N errors, as desired by a user.

In a preferred embodiment, the inventive mechanism examines elements in a memory element array, which may be a cache region or cache memory region, or other type of array employing a restricted array traversal order. Preferably, the traversal is performed so as to test the element in a particular column within a row of an array under test before moving on to elements in a succeeding rows. Such a traversal is generally referred to herein as "column-fast" traversal. The inventive mechanism preferably establishes a threshold number of faulty elements which can be present in a particular row. When this threshold is met or exceeded, the inventive mechanism preferably identifies the entire array as faulty and takes appropriate corrective action. Preferably, corrective action involves substituting an alternative area of silicon on the affected chip for the memory addresses that failed testing.

Generally, where there are faulty elements dispersed throughout an array, the faulty portions of the array are not used in favor of substitute portions. For example, row replacement may be practiced on rows of an array having one or more faulty elements. It is generally preferable to replace rows in groups because some array defects affect multiple adjacent rows. Grouping rows also generally causes row repair logic to be simplified. Moreover, such grouping preferably enables fewer CAM entries to be employed.

For example, rows may be replaced in groups of four rows. Thus, for an array comprising row 0 to row 11, a fault in an element of row 2 would result in rows 0–3 being replaced. Similarly, a fault in row 4 would result in rows 4–7 being replaced. Note that the groupings of four rows is by way of example only as a group can comprise from 1 to N rows, as desired by a user.

A problem arises when two or more rows in the same group are found to have a sufficient number of errors to exceed the threshold. This would cause the same row group to be sent twice (or more) to the repair logic. Attempting repairs to the same set of rows multiple times would cause an invalid condition to arise, which may cause the system to halt or crash. To prevent this from happening, the invention sets a flag to inhibit further repairs from being performed on rows within the group. The flag is preferably set after the threshold has been reached and the row address of the bad row has been provided to the row repair logic. Since all of the rows of the group are being repaired, then any additional errors in the group will be compensated. When all of the rows of the group have been traversed, the flag is cleared so that rows (of different groups) may be repaired if needed. Thus, duplicate repairs to rows within a group are prevented. Note that the additional rows within the group may be scanned, with correction by inhibited, or alternatively, scanning of the additional rows of the group may be skipped, such that the next row to be scanned is the first row of the next group.

The invention allows for the simplification of the testing circuitry, as bitmap hardware is no longer needed since repair is done "on the fly," or concurrently with array testing. In systems that use bitmap hardware, all testing is generally complete before repair is attempted. Bitmap hardware generally stores test results used by the repair logic.

In a preferred embodiment, the present invention also reduces circuit complexity and reduces the silicon area used on the chip. The invention also tolerates latency in the row repair logic. Thus, the row repair does not have to happen immediately, and can be deferred to a later time, while other errors can be detected. For example, when the replacement memory portion is swapped in for the defective portion, the possibility exists that failures may result from accessing memory that does not have any data. The occurrence of such failures may result from the lack of initialization of replacement memory to a known value at the beginning of the test/repair sequence. Such a lack of initialization of the new memory generally causes the new memory to contain unknown data which is likely to result in mismatches between the memory data and the expected values. Normally, the system would attempt to repair the array based on such mismatches, or apparent memory element failures, however the inhibit mechanism of the present invention preferably operates to prevent the execution of array repair in this situation.

FIG. 1 is a diagram of a subset of a RAM array 100 suitable for testing employing a preferred embodiment of the present invention. The lower left portion of FIG. 1 shows the repair logic, including row repair logic block 102. Included in FIG. 1 is an array of data storage elements organized into rows 0 through 7, having reference numerals 110 through 117, respectively, a first group of columns 0–5, having reference numerals 118–123, respectively, and a second group of columns 6–11 having reference numerals 124–129, respectively. Generally, each unique combination of row and column number identifies one data storage element. The first group of columns, defining a first cache region 130, having six columns and eight rows, and includes forth-eight data storage elements. A second cache region 131 is defined by rows 0 through 7 and columns 6 through 11. Where the device concerned is other than a cache memory region, the individual elements may be other than data storage elements. For example, in a microprocessor, such elements may be processing elements.

In a preferred embodiment, an address is provided to array 100 that is processed by row decoder 101. Preferably, a row address will be sent to row decoder 101 which will decode the address and drive one of the horizontal lines, or "word lines" across array 100. So when a word line fires across the array, all of the cells in that row are accessed and drive data onto the bit lines which are the vertical lines in the diagram. Generally, there will then be six values being presented to the column muxes 106 and 107 at the bottom of array 100.

Herein, the group of columns 0–5, reference numerals 118–123, is referred to as cache region 1, or data bit 1. Referring to the columns within cache region 1, the row number component of an address for any data storage element within array 1100, which is also known as the column address, identifies a data element within array 100 to column mux (multiplexor) 106.

In a preferred embodiment, when testing the data storage elements, the inventive mechanism writes data into array 100, thereby placing individual data storage elements within array 100 into an expected state. This stored data is later read out of array 100 and compared to an appropriate data template to determine whether the data stored in the element still holds the expected value. If the comparison indicates that the storage element under test does not hold the expected value, this comparison failure is interpreted as an indication of a hardware failure in the pertinent data storage element. The number of occurrences of faulty data storage elements in preferably counted to keep track of an extent of failure occurring within a particular cache segment. A range of remedial measures may be available depending upon the extent of failure of data storage elements within a particular cache region.

In a preferred embodiment, XOR (Exclusive-Or) gate 105 retrieves data from a column within array 100, compares the retrieved data with an expected value for the data and indicates whether the comparison succeeds or fails. If the comparison fails, counter 104 adds the failure to a running count of failures.

In a preferred embodiment, numerous options for repairing an array when one or more faults are detected therein. One approach involves using an alternative physical region on a silicon chip for an entire cache region such as cache region 130. A less drastic corrective measure generally involves replacing selected rows within a cache region, where only selected rows are found to contain faulty data storage elements.

Figure 2:
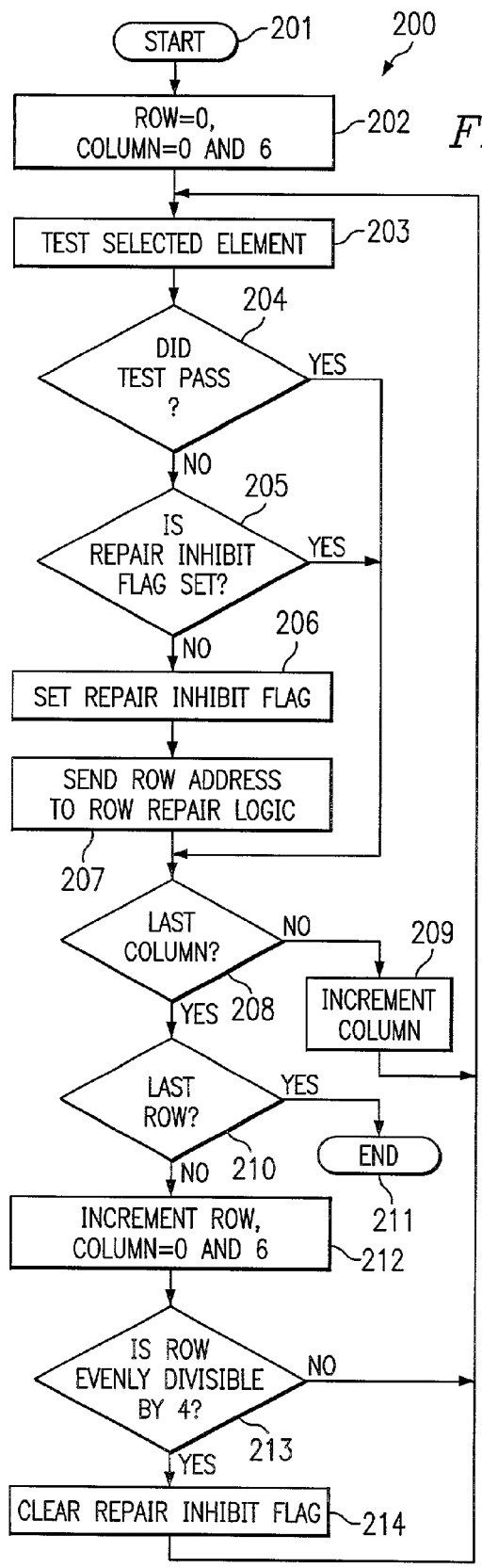
FIG. 2 depicts a flow chart that defines the inventive algorithm for testing the memory.

FIG. 2 depicts a flow chart that defines the inventive algorithm for testing the memory, for example, the memory of FIG. 1. The algorithm begins at start block 201. The algorithm preferably begins testing the element at row 0, column 0. However, the algorithm may test multiple elements in parallel, for example the element at row 0, column 0 and the element at row 0, column 6. Thus, block 202 initializes the algorithm to begin testing the first element or elements. In block 203, the element is tested. Multiple elements would be tested in parallel, thus there may be a significant number of column muxes 106, XORs 105 and counters 104, with one of each for each element that is going to be tested in parallel. The testing preferably comprises the reading out the stored contents of the element. The stored contents is compared with expected contents. In block 204 the test results are examined, if there is a match, then there is no error, and the algorithm proceeds with block 208. If there is not a match, then there is an error, and the counter 104 is incremented by one, and the algorithm proceeds with block 205.

Block 205 determines if the repair inhibit flag is set. If the flag is set, then the algorithm proceeds with block 208 as no repairs are to be taken, as this faulty element has been addressed by a repair to a previous element in the same row group. If the flag is not set, then algorithm sets the flag in block 206 and sends the row address to the repair logic in block 207. The repair logic would then preferably repair or otherwise swap all of the rows in the row group that includes the faulty row with substitute rows from the replacement memory. After block 207, the algorithm proceeds with block 208.

Block 208 determines whether the element being tested is the last element of the current row, i.e. whether the element is in the last column of the data bit. If not, then the algorithm increments the column, i.e. moves to the next element, and proceeds with the testing of the next element at block 203. If the current element is the last element of the row, then the algorithm proceeds with block 210.

Block 210 determines whether the element being tested is in the last row. If so, then the algorithm ends 211, as the current element is the last element of the last row. If not, then the algorithm proceeds with block 212, wherein the row is incremented, and the column is initialized back to the first element of the row, e.g. column 0. If multiple elements are being tested, then the column is initialized to the first elements of the data bits for that row, e.g. column 0 and column 6. The algorithm proceeds with block 213.

Block 213 determines whether a new row group has been started. If so, then the algorithm clears the repair inhibit flag in block 214 and then proceeds with testing in block 203. If not, then the algorithm proceeds with testing in block 203. Block 213 preferably determines if the row is evenly divided by N. Where N is the number of rows in each row group. For example, N equals four. Note that this assumes that the first row begins with zero, thus row N (or a multiple thereof) would be in the next group. For example, for N equal four, the first group would comprise rows 0–3, the second group would comprise rows 4–7, the third group would comprise 8–11, etc.

Note that the algorithm can be modified to include a threshold level. A counter block could be added after block 204, such that the no path increments the counter 104, and a decision block is then checked to see if the counter 104 equals a predetermined threshold value. If so, then the algorithm proceeds into block 205, if not then the algorithm proceeds into block 208. Also note that block 212 would include a clear counter command so that the counter 104 is re-initialized for each row. It will be appreciated that while employing the mechanism of the present invention, multiple errors can be handled.

Further note that the algorithm can be modified such that an error in one element causes testing of subsequent elements in that same row be skipped. Thus, the next element to be tested would be the first element on the next row. Also, the algorithm can be modified such that an error in one element causes testing of subsequent elements in that same row group to be skipped. Thus, the next element to be tested would be the first element on the first row of the next row group.

Figure 3:
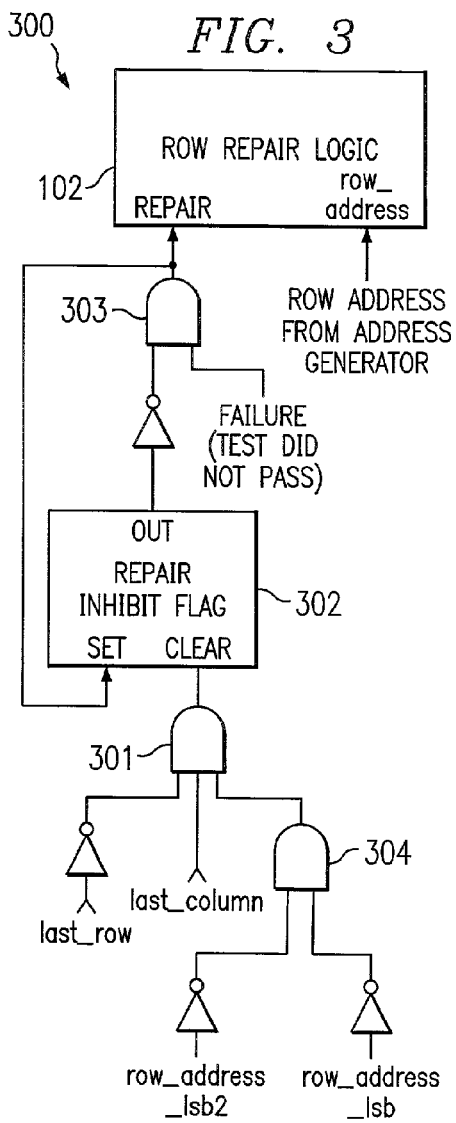
FIG. 3 depicts an arrangement for a preferred embodiment for the repair inhibit flag of the invention.

FIG. 3 depicts an arrangement 300 for a preferred embodiment for the repair inhibit flag. The repair inhibit flag is stored in register 302. The output of register 302 is fed to AND gate 303, which also receives a bit indicating whether the current element failed testing (1 for failure). If the flag is 0 and the element failed testing, then AND gate 303 enables row repair logic 102. The logic 102 is also provided with the row address from the row address generator. This allows the row logic to repair the row group that comprises the faulty row indicated by the row address. The repair signal is high when the failure signal is high and the repair inhibit flag is clear. Two events happen when the repair signal is high. First, the row repair logic executes a repair operation for the row group that includes the row indicated on the 'row_address'. Second, the repair inhibit flag is set.

The output of the AND gate 303 also services to set the repair inhibit bit in the register 302. Elements 301 and 304 operate to clear the flag in the register if 1) the current column is the last column, 2) if the current row is not the last row, and 3) if the incremented row is the first row of the next row group. AND gate 304 receives the inverse of two signals. First, the row_address_lsb signal, or the least significant bit (LSB) of the row address, and second the row_address_lsb2 signal., or the "next to" least significant bit (LSB) of the row address. The ANDing of the inverse of these two signals provides an indication whether the row address is divisible by four, which is the example shown in the FIGURES. Note that for row groups that comprise other than four row, e.g. N, different logic would be provided to check if row address is divisible by N. The output of AND 304 is an input to AND 301. AND 301 also receives two other signals, namely the last_column signal and the last_row signal. The last_column signal is normally low and transitions to high when the current column is the last column of the current memory (or cache) segment. The last_row signal is normally low and transitions to high when the current row is the last row of the current cache segment. The AND 301 generates the signal that clears the repair inhibit flag.

FIG. 4 depicts an example of the implementation 400 of replacement memory 401. The replacement memory 401 is used by the row repair logic 102 to replace faulty rows in memory area 130, 131. The bad row address FIFO 402 keeps track of faulty rows and enables repair. All but the two least significant bits (LSBs) of the faulty row address are stored into this FIFO. When a row address is requested that matches one of the row addresses stored in the FIFO, the corresponding 'match' signal goes high and enables the appropriate decoder 403. The activated decoder in turn chooses one of the four word lines (labeled w0 through w3) based on the two LSBs of the row address, and accesses the appropriate row of replacement memory.

FIG. 5 depicts an example of the implementation 500 of the row repair multiplexor 502. There would one multiplexor for each column. The multiplexor (MUX) 502 has two inputs, with one input having data from the normal memory array, e.g. 130, 131, and the other input having data from the replacement memory 401. When one of the match signals from FIG. 4 is high, then the MUX 502 selects the data from replacement memory 401 rather than from normal memory 130, 131. Thus, this MUXing facilitates the repair of bad memory.

When implemented in software, the elements of the present invention are essentially the code segments to perform the necessary tasks. The program or code segments can be stored in a processor readable medium or transmitted by a computer data signal embodied in a carrier wave, or a signal modulated by a carrier, over a transmission medium. The "processor readable medium" may include any medium that can store or transfer information. Examples of the processor readable medium include an electronic circuit, a semiconductor memory device, a ROM, a flash memory, an erasable ROM (EROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

FIG. 6 illustrates computer system 600 adapted to use the present invention. Central processing unit (CPU) 601 is coupled to system bus 602. The CPU 601 may be any general purpose CPU, such as an HP PA-8500 or Intel Pentium processor. However, the present invention is not restricted by the architecture of CPU 601 as long as CPU 601 supports the inventive operations as described herein. Bus 602 is coupled to random access memory (RAM) 603, which may be SRAM, DRAM, or SDRAM. ROM 604 is also coupled to bus 602, which may be PROM, EPROM, or EEPROM. RAM 603 and ROM 604 hold user and system data and programs as is well known in the art.

Bus 602 is also coupled to input/output (I/O) controller card 605, communications adapter card 611, user interface card 608, and display card 609. The I/O card 605 connects to storage devices 606, such as one or more of a hard drive, a CD drive, a floppy disk drive, a tape drive, to the computer system. Communications card 611 is adapted to couple the computer system 600 to a network 612, which may be one or more of a telephone network, a local (LAN) and/or a wide-area (WAN) network, an Ethernet network, and/or the Internet network. User interface card 608 couples user input devices, such as keyboard 613 and pointing device 607, to the computer system 600. The display card 609 is driven by CPU 601 to control the display on display device 610.

What is claimed is:

1. A method for managing an error in a plurality of elements, the method comprising:
    testing an element of the plurality of elements;
    detecting the error in the element;
    repairing a group of N elements of the plurality of elements, wherein N is greater than one and the group of N elements includes the element; and
    inhibiting subsequent repairing of the group of N elements.

2. The method of claim 1 wherein the step of inhibiting comprises:
    setting an inhibit flag which prevents the step of repairing from subsequently operating on elements of the group of N elements.

3. The method of claim 1 wherein the step of repairing comprises
    invoking a group of replacement elements which is used in place of the group of N elements.

4. The method of claim 1 wherein:
    the elements are memory elements of an array, and
    the array comprises a plurality of rows and a plurality of columns.

5. The method of claim 4 further comprising:
    initializing a row register and a column register to a first element in the array, prior to the step of testing.

6. The method of claim 4 wherein the step of inhibiting comprises:
    checking, after detecting of the error, whether an inhibit flag which prevents the step of repairing from subsequently operating on elements of the group of N elements is set; and
    if the inhibit flag has not been set, sending a row address of the element to row repair logic for performing the step of repairing the setting the inhibit flag; and
    if the inhibit flag has been set, inhibit operation of the row repair logic.

7. The method of claim 6 wherein the rows are numbered from 0 to X(N−1) for a total of XN rows, and X is an positive integer, the method further comprising:
    clearing the inhibit flag prior to the step of testing, if a row register is equal to a multiple of N.

8. The method of claim 4 wherein the step of testing comprises:
    incrementing a column register and repeating the step of testing an array element until the last column of the row; and
    incrementing a row register and repeating the steps of testing and incrementing the column register until the last row of the array.

9. A computer program product having a computer readable medium having computer program logic recorded thereon for managing an error in a plurality of elements, the computer program product comprising:
    means for locating an error in one element of the plurality of elements;
    means for replacing a group of N elements of the plurality of elements with replacement elements, wherein N is greater than one and the group of N elements includes the one element; and
    means for inhibiting subsequent operation of the means for replacing the elements of the group of N elements.

10. The computer program product of claim 9, wherein the means for inhibiting comprises:
    means for setting an inhibit flag which prevents the means for replacing from subsequently operating on elements of the group of N elements.

11. The computer program product of claim 9 wherein:
    the elements are memory elements of an array, and
    the array comprises a plurality of rows and a plurality of columns.

12. The computer program product of claim 11 wherein the means for inhibiting comprises:
    means for checking, which is operative after location of an error, whether an inhibit flag which prevents the means for replacing from subsequently operating on elements of the group of N elements is set;
    wherein if the inhibit flag has not been set, a row address of the element is provided to the means for replacing, and the means for inhibiting sets the inhibit flag; and
    if the inhibit flag has been set, the means for inhibiting prevents operation of the means for replacing.

13. The computer program product of claim 12 wherein the rows are numbered from 0 to X(N−1) for a total of XN rows, and X is an positive integer, the computer program product method comprising:
    means for clearing the inhibit flag, prior to the step of testing, if a row register is equal to a multiple of N.

14. The computer program product of claim 11 further comprising:
    means for testing an array element, which is operative, prior to the operation of the means for locating;
    means for incrementing a column register and repeating the operation of the means for testing an array element until the last column of the row; and
    means for incrementing a row register and repeating the operation of the means for testing and the means for incrementing the column register until the last row of the array.

15. A system for preventing duplicate cache memory repairs in a memory array of a plurality of memory elements, the system comprising:

read circuitry that reads out the contents of a portion of the memory array, wherein the portion comprises at least two elements of the plurality of memory elements;

compare circuitry that compares the contents with expected contents and detects an error in the portion;

repair logic that repairs a group of N elements of the plurality of memory elements, wherein N is greater than one, and the group of N elements includes the portion; and inhibit circuitry that prevents the repair logic from subsequently operating on the group of N elements.

16. The system of claim 15 wherein the inhibit circuitry sets an inhibit flag which is used to prevent the repair logic from subsequently operating on the group of N elements.

17. The system of claim 15 wherein the repair logic invokes a group of replacement memory elements which is used instead of the group of N elements.

18. The system of claim 15 wherein:

the array comprises a plurality of rows and a plurality of columns, and the portion is a row;

the inhibit circuitry determines, after detection of the error, whether an inhibit flag is set, which prevents the repair logic from subsequently operating on elements of the group of N elements; and if the inhibit flag has not been set, a row address of the element is sent to the repair logic, and the inhibit circuitry sets the inhibit flag, and if the inhibit flag has been set, the inhibit circuitry prevents operation of the repair logic.

19. The system of claim 15 wherein:

the rows are numbered from 0 to $X(N-1)$ for a total of $XN$ rows, and X is an positive integer; and the inhibit circuitry clears the inhibit flag prior to the operation of the compare circuitry, if a row register is equal to a multiple of N.

\* \* \* \* \*

UNITED STATES PATENT AND TRADEMARK OFFICE
CERTIFICATE OF CORRECTION

PATENT NO. : 7,055,074 B2
APPLICATION NO. : 09/842333
DATED : May 30, 2006
INVENTOR(S) : Brian William Hughes et al.

Page 1 of 1

It is certified that error appears in the above-identified patent and that said Letters Patent is hereby corrected as shown below:

In column 3, line 61, delete "forth-eight" and insert -- forty-eight --, therefor.

In column 4, line 14, delete "1100" and insert -- 100 --, therefor.

In column 4, line 28, delete "in" and insert -- is --, therefor.

In column 7, line 47, in Claim 3, delete "comprises" and insert -- comprises: --, therefor.

In column 7, line 65, in Claim 6, after "repairing" delete "the" and insert -- and --, therefor.

Signed and Sealed this

Seventeenth Day of March, 2009

JOHN DOLL
*Acting Director of the United States Patent and Trademark Office*